(12) United States Patent
DeWeese et al.

(10) Patent No.: US 12,387,106 B1
(45) Date of Patent: Aug. 12, 2025

(54) ADAPTATION TO DETECTED FLUCTUATIONS IN OUTPUTS ACROSS ARTIFICIAL INTELLIGENCE MODELS

(71) Applicant: Airia LLC, Alpharetta, GA (US)

(72) Inventors: William DeWeese, Cocoa, FL (US); Erich Stuntebeck, Johns Creek, GA (US)

(73) Assignee: Airia LLC, Alpharetta, GA (US)

( * ) Notice: Subject to any disclaimer, the term of this patent is extended or adjusted under 35 U.S.C. 154(b) by 0 days.

(21) Appl. No.: 18/786,407

(22) Filed: Jul. 26, 2024

Related U.S. Application Data

(60) Provisional application No. 63/658,434, filed on Jun. 10, 2024, provisional application No. 63/650,487, filed on May 22, 2024.

(51) Int. Cl.
*G06N 3/088* (2023.01)
*G06N 3/0475* (2023.01)

(52) U.S. Cl.
CPC ........... *G06N 3/088* (2013.01); *G06N 3/0475* (2023.01)

(58) Field of Classification Search
CPC .............................. G06N 3/088; G06N 3/0475
See application file for complete search history.

(56) References Cited

U.S. PATENT DOCUMENTS

| | | | |
|---|---|---|---|
| 2018/0357224 A1* | 12/2018 | Yamauchi | G06F 40/51 |
| 2021/0200956 A1* | 7/2021 | Ding | G06F 40/30 |
| 2022/0300711 A1* | 9/2022 | Elisco | G06F 16/93 |
| 2023/0074406 A1* | 3/2023 | Baeuml | G10L 15/22 |
| 2023/0325725 A1* | 10/2023 | Lester | G06N 3/0455 |
| 2023/0343324 A1* | 10/2023 | Baeuml | G10L 15/22 |
| 2023/0386450 A1* | 11/2023 | Eby | G06F 40/284 |
| 2024/0202458 A1* | 6/2024 | Zha | G06F 40/279 |
| 2024/0249081 A1* | 7/2024 | UzZaman | G06F 40/40 |
| 2024/0256791 A1* | 8/2024 | Santhanam | G06F 40/284 |

OTHER PUBLICATIONS

Klabunde et al. "Similarity of Neural Network Models: A Survey of Functional and Representational Measures" Aug. 6, 2023, arxiv.org, https://arxiv.org/abs/2305.06329v2 (Year: 2023).*
Klabunde et al. "Towards Measuring Representational Similarity of Large Language Models" Dec. 5, 2023, arxiv.org, https://arxiv.org/abs/2312.02730v1 (Year: 2023).*

(Continued)

*Primary Examiner* — James D. Rutten
(74) *Attorney, Agent, or Firm* — Clayton, McKay & Bailey, PC

(57) ABSTRACT

Systems and methods are described for a maintaining consistent and reliable outputs from artificial intelligence ("AI") based search systems that use pipelines with a dataset, AI model, and prompt. An application can send a query through a pipeline and set the result as a baseline for future results. The application can periodically resend the query through the pipeline and compare the new results to the baseline. If the new results vary from the baseline above a predetermined threshold, then corrective measures can be taken. This can include notifying an administrator or querying the pipeline for how to change the prompt so that results are more similar to the baseline.

20 Claims, 8 Drawing Sheets

(56) References Cited

OTHER PUBLICATIONS

Pryzant et al. "Automatic Prompt Optimization with 'Gradient Descent' and Beam Search" Oct. 19, 2023, arxiv.org, https://arxiv.org/abs/2305.03495 (Year: 2023).*
Cheung, "An Introduction to LLM Evaluation: How to measure the quality of LLMs, prompts, and outputs" May 15, 2024, Codesmith, https://www.codesmith.io/blog/an-introduction-to-llm-evaluation-how-to-measure-the-quality-of-llms-prompts-and-outputs (Year: 2024).*
Kim et al. "EvalLM: Interactive Evaluation of Large Language Model Prompts on User-Defined Criteria" Feb. 27, 2024, arxiv.org, https://doi.org/10.48550/arXiv.2309.13633 (Year: 2024).*
Devansh et al. "How to build unit tests for LLMs using Prompt Testing" Apr. 26, 2024, Medium.com, https://machine-learning-made-simple.medium.com/how-to-build-unit-tests-for-llms-using-prompt-testing-f59c3826ed0e (Year: 2024).*
Notice of Allowance in U.S. Appl. No. 18/786,402, dated Oct. 8, 2024.

* cited by examiner

ADAPTATION TO DETECTED FLUCTUATIONS IN OUTPUTS ACROSS ARTIFICIAL INTELLIGENCE MODELS

CROSS-REFERENCES TO RELATED APPLICATIONS

This application claims priority as a non-provisional application to U.S. provisional application No. 63/658,434, titled "Artificial Intelligence Pipeline Platform," filed on Jun. 10, 2024, the contents of which are incorporated herein in their entirety. This application also claims priority as a non-provisional application to U.S. provisional application No. 65/546,801, filed May 15, 2024, and to U.S. provisional application No. 63/650,487, filed May 22, 2024, both of which are incorporated herein in their entirety.

BACKGROUND

The present invention relates to artificial intelligence ("AI") systems and, more specifically, to monitoring and maintaining the consistency of results generated by AI pipelines.

AI pipelines are increasingly being used across various industries to automate complex tasks, derive insights from large datasets, and support decision-making processes. These pipelines often involve multiple stages, including data preprocessing, model training, and result generation. Despite their sophistication, AI pipelines can sometimes produce results that are inconsistent or diverge semantically over time due to a variety of factors such as model drift, data variability, or changes in input characteristics. Therefore, even when a prompt package is unchanged, the output can begin to semantically drift. This can be a problem in applications that rely on consistent outputs from AI pipelines.

Popular large language models ("LLMs") are constantly evolving, with new versions of the LLM and also new system prompts that the user does not have visibility into. System prompts act as guiderails for the LLM's answers. When either the LLM version or system prompts change, the output of an AI pipeline can change even though the prompt package used in the AI pipeline remains the same.

Existing methods for ensuring the consistency of AI-generated results are purely reactive. When the AI pipeline breaks or provides unusable results, the customer is left experimenting with new prompts to guide the AI pipeline back to acceptable outputs. However, these reactive approaches are labor-intensive, time-consuming, erode customer trust, and may not be sufficiently responsive to real-time changes in the pipeline's behavior.

An AI platform needs a way to detect prompt breakage before it impacts customers. Otherwise customers will feel the need to implement their own more costly and complicated platforms. Existing methods often lack a robust mechanism for detecting and addressing semantic divergence in the results produced by AI pipelines. Semantic divergence refers to changes in the meaning or context of the outputs that are not easily detectable through statistical or syntactic analysis alone. This type of divergence can lead to significant issues, particularly in applications where consistency and accuracy of the results are critical, such as in healthcare diagnostics, financial forecasting, and autonomous systems.

There is, therefore, a need for a more efficient and automated solution that can continuously monitor the results produced by AI pipelines, detect semantic divergence, and implement corrective actions to maintain the consistency and reliability of the outputs.

SUMMARY

Examples described herein include systems and methods for maintaining consistent and reliable outputs from AI-based search systems that implement a pipeline-based infrastructure. These pipelines typically consist of a dataset, an LLM, and a prompt.

The invention provides a robust solution by implementing a monitoring system that detects semantic divergence in the results produced by AI pipelines. A prompt engine can execute on a server as part of an AI platform where the AI pipelines are created and maintained. The prompt engine can detect changes in viability of prompt packages used in the AI pipelines, which can be caused by changes to AI services that the respective pipeline utilizes.

Initially, the prompt engine can establish baseline results by sending a series of baseline queries to the pipeline and storing the pipeline output. The queries can be part of a conversation or some other series of interactions by an application that uses the AI pipeline. The conversations can be held by test personas, in an example. Subsequently, the prompt engine can periodically use test queries that are semantically similar to the baseline queries to test the pipeline. This can include using the same test personas, which can utilize the pipeline output in formulating a substantive follow-up query as compared to the historical conversation with baseline results. Test results of the test queries are semantically compared to the baseline results. The comparison is made at each result along the sequential set of queries. If the comparison reveals a variance exceeding a predetermined threshold, corrective actions are initiated.

Corrective actions can include querying the LLM to suggest modifications to the prompts that could realign the results with the baseline. If the LLM suggests a modification that does make new results more semantically similar to the baseline results, then the prompts for the pipeline can be updated accordingly. Additionally, the system can notify an administrator to review and address the divergence.

In certain embodiments, the system allows for the establishment of baselines tailored to multiple personas. Each persona can be defined by prompt packages that are input to the LLM. This ensures that the results for each persona are tested and maintained within acceptable variance limits. This can help detect output variance for a variety of different types of users, since the semantic drift may only occur of a subset of user types. The personas can represent, for example, different roles within an enterprise, different cultures, different diets, different ages, sexes, and so on, depending on the AI pipeline. Additionally, although LLMs are referred to herein, any language model (including small language models) can also be used in the discussed examples.

The AI platform can store prompt packages for use in the AI pipelines. Prompt packages can ensure that the LLM results include particular content and exclude other content, and that the results are formatted for use with an AI application that utilizes the AI pipeline. When the LLM provides corrective prompt suggestions in response to semantic divergence, the corrective prompt suggestions can be stored for future use. The corrective prompt suggestions can be stored in connection with the same LLM version for which the corrective prompt suggestion was created. That way, the AI pipeline can use the corrective prompt suggestions when querying with that LLM version to maintain outputs with semantic predictability.

By implementing this method, the invention ensures that AI pipelines deliver consistent and reliable results, thereby enhancing the reliability and trustworthiness of AI-based search systems.

In some examples, the prompt engine can analyze the semantic similarity of results provided by different versions of the same LLM. For example, the prompt engine can send the same test query (or set of queries) through AI pipelines that use different versions of the same LLM. The other components of the AI pipelines (e.g., dataset and prompts) can be identical. The prompt engine can semantically compare results provided by the different LLM versions and determine whether they semantically diverge. If so, then the prompt engine can perform a corrective action. For example, the prompt engine can notify an administrator or attempt to identify a prompt that can be added to one of the pipelines so that they no longer diverge semantically.

The examples summarized above can each be incorporated into a non-transitory, computer-readable medium having instructions that, when executed by a processor associated with a computing device, cause the processor to perform the stages described. Additionally, the example methods summarized above can each be implemented in a system including, for example, a memory storage and a computing device having a processor that executes instructions to carry out the stages described.

Both the foregoing general description and the following detailed description are exemplary and explanatory only and are not restrictive of the examples, as claimed.

DESCRIPTION OF THE EXAMPLES

Reference will now be made in detail to the present examples, including examples illustrated in the accompanying drawings. Wherever possible, the same reference numbers will be used throughout the drawings to refer to the same or like parts.

This invention addresses the issue of inconsistent outputs from AI pipelines caused by changes in datasets, language models, or prompts. A prompt engine establishes a baseline result from an initial set of queries, then periodically sends test queries to compare results semantically against the baseline. If variance exceeds a predetermined threshold, corrective actions are taken, such as adjusting prompts or notifying an administrator. The system also supports multiple personas, allowing tailored baselines for varied user needs. This ensures consistent, reliable results from AI-based search systems, enhancing their reliability and trustworthiness.

References are made throughout to LLMs. However, those references are merely used as examples and are not intended to be limiting in any way. For example, LLM can encompass any language model, such as a small language model ("SLM").

Figure 1:
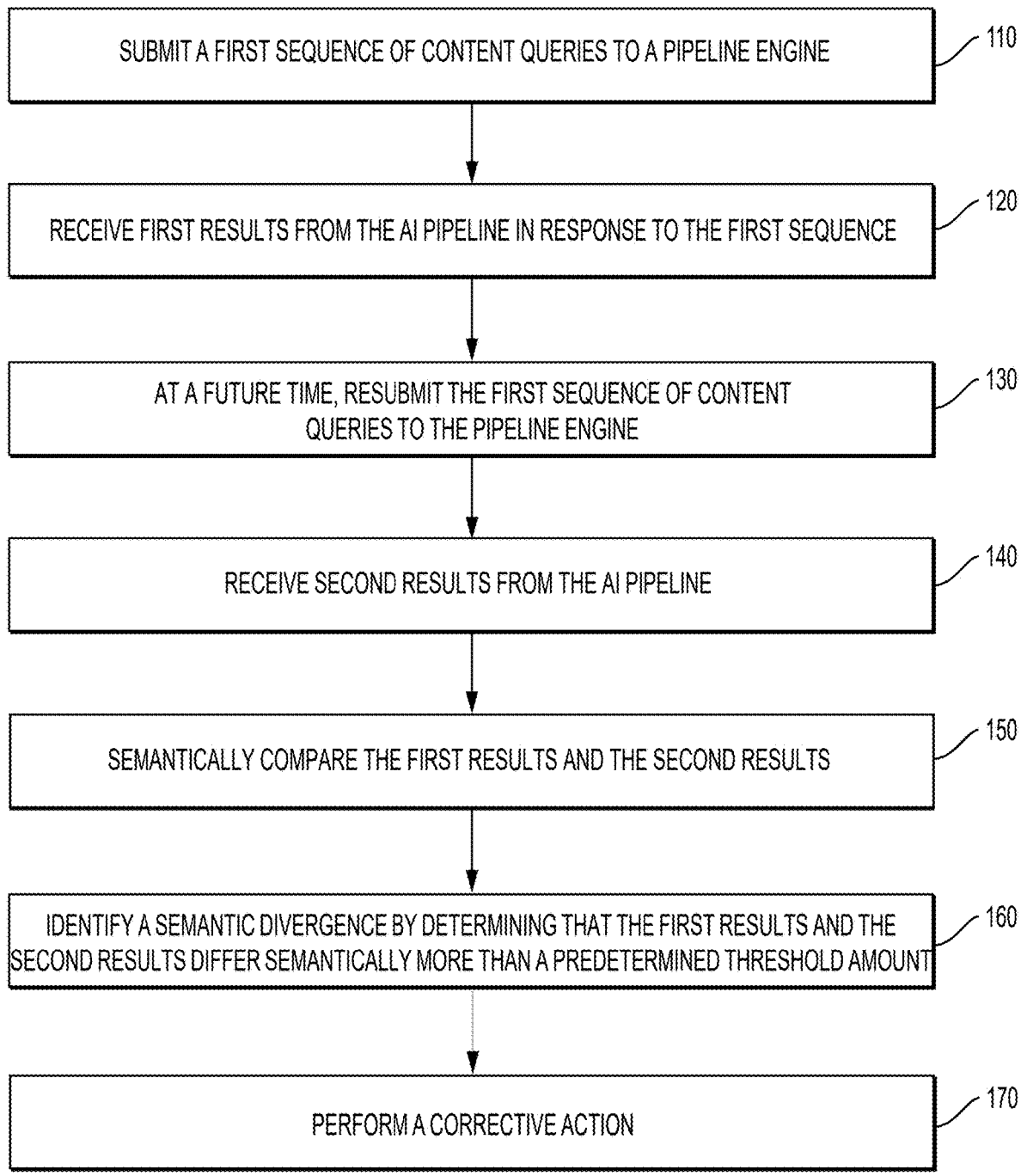
FIG. 1 is a flowchart of an example method for maintaining consistent outputs from AI pipelines.

FIG. 1 is a flowchart of an example method for maintaining consistent outputs from AI pipelines. A prompt engine can periodically test an AI pipeline by submitting a sequence of inputs and semantically comparing outputs of the AI pipeline to historical outputs. If the comparison reveals a semantic drift, then the prompt engine can attempt to generate and suggest one or more prompt changes to remedy the drift.

At stage 110, a prompt engine in an AI platform can submit a sequence of content queries to an AI pipeline. The sequence can be part of a list of test queries. In one example, the prompt engine can utilize personas to perform multiple different tests of the pipeline. Each persona can be emulated by an LLM according to persona prompts that describe the persona. The LLM can then add a persona's perspective to follow-up queries in the list of queries while also taking into account the prior pipeline results of that particular test. In another example, the test queries can be a set of user-supplied inputs. For example, the test queries can be based on a recorded set of inputs that a testing user inputs into a query window one at a time.

The AI platform where the testing occurs can be an integrated environment that provides tools, frameworks, and infrastructure that allows users to develop, test, deploy, and manage AI pipelines. An AI pipeline can be a sequence of processes and components that work together to perform tasks using artificial intelligence. For example, an AI pipeline can include a dataset, an LLM, and a prompt package. The dataset provides the information that the model learns from, the LLM processes and generates responses based on the data, and the prompt package can be a collection of pre-designed prompts, templates, guidelines, and tools aimed at facilitating effective interactions with the LLM. These prompt packages help users generate high-quality inputs to elicit desired responses from the model, ensuring consistency, relevance, and accuracy across various applications. The term dataset is synonymous with the term data source. The prompt packages can be tailored for specific tasks, applications, or domains, providing a structured way to generate high-quality prompts that elicit desired responses from an LLM.

The AI platform can include a graphical user interface ("UI") that allows users to design and manage the AI pipelines. For example, using the UI a user can designate or modify the dataset, LLM, and/or prompt packages used in a pipeline. A user can create AI pipelines that uniquely suit their needs. The UI can be part of an application that a user can download and install on a user device, such as a personal computer, tablet, or mobile phone.

The prompt engine is a component of the AI platform that generates, refines, and manages prompt packages to effectively interact with LLMs. In addition to managing prompt packages in a production environment, the prompt engine can periodically test for semantic drift of AI pipelines in a test environment, as described herein. The pipeline testing can be an optional service that can be deployed for any AI pipeline managed by the AI platform. For example, the UI of the AI platform can allow a customer to turn pipeline testing on or off on a particular pipeline or designate when or how often the prompt engine should test a pipeline for semantic drift.

In one example, an AI platform associated with the pipeline can process the input, such as a content query, according to the steps of the AI pipeline being tested. More specifically, a pipeline engine of the AI platform can execute these steps. In one example, a different pipeline engine instance can execute for every pipeline. Alternatively, one or more pipeline engines in the AI platform can be responsible for multiple pipelines.

One potential step in an AI pipeline is to query a vector database that includes one or more datasets. The pipeline engine can identify a dataset associated with the query. This information can be part of the query itself, in an example. If the application has capabilities to search multiple different datasets, then the query can indicate which ones are applicable. A default dataset can be used with particular applications.

A vector database search can be based on semantic meaning, as opposed to an exact keyword search. The pipeline engine can vectorize the content query using the embedding model associated with the identified dataset. Alternatively, an LLM can be used prior to the vectorization to retrieve a semantic meaning and/or related search keywords. The pipeline engine generates content query vectors with the same embedding model that generates a vector database for the identified dataset. In general, the same embedding model is used so that the vectors of the content query will share the characteristics of those in the vector database of the dataset. In particular, the vectors will exist in the same dimensional space, allowing them to be comparable in terms of semantic meaning. This is because the vectors represent the semantic meaning of the respective chunk, with added dimensionality generally allowing for more nuance in the semantic meaning.

To perform a multidimensional search with the content query, the pipeline engine can compare the query vectors output from the embedding model against the vector database of the identified dataset. This can allow for finding content chunks of the dataset that share a similar semantic meaning to the query itself. To identify similar vectors (i.e., those with similar semantic meaning), the distance and/or angle between the vectors can be determined. The closer the two vectors, the closer in meaning they are. In one example, vectors of the vector database that have a threshold similarity to the content query vectors are identified as similar. The threshold similarity can be a distance value, with vectors of less distance than that threshold being counted as similar. The distance is measured within the embedding space, which again can have different dimensionality depending on policies and user selections.

The pipeline engine can then retrieve chunks that correspond to the identified similar vectors. The chunks can be stored in the vector database with the corresponding vectors. The vectors can be embedded with metadata that allows the pipeline engine to locate the corresponding content item, user access permissions, location of the respective chunk within the content item. This metadata can include identifiers, source information, timestamps, privileges, and other relevant details. Again, the chunks can include the text or other information that was transformed into vectors by the embedding model.

The prompt engine can also mimic various access permissions as part of the test. For example, each persona can have a fictitious user profile, complete with group information and access credentials. One persona can be an executive, whereas another persona is a software developer. The respective user profiles can include relevant group information for those different persona types. The pipeline engine can access the user profile of the persona when encountering management policy metadata or code blocks in the pipeline. For example, embedded metadata can indicate that a particular group identifier is needed to access a data chunk that corresponds to a semantically similar vector.

Another step in the AI pipeline can utilize an AI service, such as an LLM, to make edits to the query, to format the retrieved data chunks, or even to add information to what has been retrieved so far. For such a step, the pipeline engine can identify a first AI service for executing the step. This AI service can be a default setting for the pipeline. But the AI service can also be identified based on the dataset and management policies. AI services can vary depending on the specific pipeline deployed and based on the user—in this case the test persona. Potential AI services include LLMs, such as a GPT model, and can allow for chat and conversation interaction, chat and conversation creation, code generation, journalistic content creation, question answering, etc. The AI services can be selected based on being trained to assist with specific topics or dataset types.

The pipeline can then send prompts to the identified AI service. The prompts can be part of a prompt package maintained for use with the AI service in the particular pipeline. An administrative user can assign one or more prompts for use with a language model. The prompt package can include the assigned prompts and additional system prompts that can be included for security or other purposes, such as prompts that prevent code injection or prompt leakage. The prompts can guide how the AI service uses the supplied query, identified similar chunks, and other context. Prompts can be stored on the platform for use in the pipeline. The prompts can also be generated based on the identified chunks, the query, and prompt policies. As an example, the prompts can specify using only the most relevant four chunks for preparation for display in the limited display space of a user device. The device type of the persona can drive a prompt regarding the number of results to prepare, for example. The prompts can also specify how much text to display so that the user can recognize the relevant search results.

The pipeline engine can transmit the generated prompts to the AI service. The prompts can be formatted in a way that the AI service understands, such as through use of an Application Programming Interface ("API") for the AI service.

At stage 120, the prompt engine can receive results from the AI pipeline. Those results can be further processed according to the particular pipeline, such as by adding annotations or hyperlinks to relevant documents and sections. This can alternatively be done by the AI service, in an example. The processed results can then be sent to the prompt engine.

The prompt engine can save the results as a baseline. For example, the prompt engine can store the baseline results in a storage device, such as a database server. In one example, the results can be saved in a vector database ("VectorDB"). A VectorDB is a type of database designed specifically for storing and managing high-dimensional vector representations of data. The prompt engine can save various forms of the baseline results. As an example, the prompt engine can save the text response that would be displayed to a user. The prompt engine can also save the vector embeddings created from the query and vectors associated with the baseline results.

The prompt engine can also save various metadata with the baseline results. For example, this metadata can include the query submitted to the pipeline, the prompt used by the AI service, a name and version number of the LLM that produced the results, any available information about the data set, and so on. The baseline results can be used to determine whether some aspect of the pipeline has changed in a way that causes results to change greater than a tolerable amount. This is described in more detail below.

In one example, the baseline results are stored in a JSON format where the pipeline inputs and outputs are stored together. This can allow for recreating a interactions (called "conversations" for convenience) with multiple inputs and outputs. The inputs and outputs can build on one another in some pipeline interactions. The baseline results can allow for recreating the interactions and determining whether semantic divergence is occurring.

At stage 130, at a future time, the prompt engine can resubmit the first sequence of inputs to the pipeline. These can be identical inputs, or can vary based on how each persona interprets an output from the pipeline and formulates the next input based on both the historical input of the baseline results and the output just received from the pipeline. Therefore, resubmitting the queries can include submitting the same queries or semantically similar queries based on an LLM's interpretation of a prior pipeline output and the persona prompts.

By maintaining the same query parameters, the results generated from this second set of queries can be directly compared to the baseline results established from the first set of queries.

The prompt engine can resubmit the content queries at any time after the baseline results are created. For example, the second content query can be submitted a day, a week, or a month later. The time between queries can be set automatically or by an administrator ("admin"). In one example, the prompt engine can submit queries at regular or nonregular intervals. The results of each query can be compared to the baseline results for semantic deviation.

The semantic deviation can be determined in real time, in one example. For example, as each result is received from the pipeline, it can be compared against the corresponding baseline result. Alternatively, the respective results can be compared at the end of the entire set of inputs for the full interactive test session.

At stage 140, the prompt engine can receive results from the AI pipeline. These results can be further processed according to the particular pipeline, such as by adding annotations or hyperlinks to relevant documents and sections. This can alternatively be done by the AI service, in an example. The processed results can then be sent to the prompt engine.

At stage 150, the prompt engine can semantically compare the baseline results and the results from the resubmission. In an example, the comparison can be a VectorDB comparison. For example, the prompt engine can retrieve both the baseline vectors and the new vectors from the vector database. The prompt engine can then calculate the distance between corresponding pairs of vectors from the baseline and new sets. Some distance metrics that can be used include Euclidean distance, cosine similarity, or Manhattan distance. For Euclidean distance, the prompt engine can create a validation dataset with pairs of texts labeled as similar or dissimilar and calculate the Euclidean distances for these pairs. For cosine similarity the cosine of the angle between two vectors is measured, which effectively captures the semantic similarity between the text representations. The Manhattan distance between two vectors is calculated as the sum of the absolute differences of their corresponding components. A lower score for Euclidean distances and Manhattan distances indicates greater similarity, and a higher score in cosine similarity indicates greater similarity.

At stage 160, the prompt engine can identify a semantic divergence by determining that the first and second results semantically deviate more than an allowable predetermined threshold. The predetermined threshold can depend on the method used to determine semantic similarity. For example, if the prompt engine performs the semantic comparison using Euclidean distance or Manhattan distance, then the threshold can be a maximum distance. If cosine similarity is used, the threshold can be a minimum angle between vectors. The prompt engine can compare the measured value to the threshold value.

In examples where a sequence of test query submissions is used to test the pipeline, the prompt engine can do multiple semantic comparisons. In one such example, the prompt engine can semantically compare each test result in the sequence with its corresponding baseline result. If any comparison exceeds the threshold, then the prompt engine concludes that semantic divergence is occurring in the pipeline. In another example, the prompt engine can average the scores of each query and compare the average to the threshold. In still another example, the prompt engine can semantically compare only the last query in the sequence.

At stage 170, in response to the identified semantic divergence, the prompt engine can perform a corrective action. The corrective actions can be one or more actions. An admin user can configure the corrective action that the application performs. In one example, the prompt engine can request the AI pipeline to modify the prompt package so that the original query (or string of queries) returns results that are more similar to the baseline results from the first query. The prompt engine can allow the AI pipeline to decide how to modify the prompt package, or, alternatively, the prompt engine can specify a method for modifying the prompt package. Non-exhaustive examples of modifying the prompt package can include rephrasing the prompt package using synonyms or related terms that are more aligned with the old results, adding relevant terms or phrases from the old results to the prompt package, and using reinforcement learning or optimization techniques to adjust the query iteratively to maximize similarity. The prompt engine can then test the modified prompts by submitting the original query with the modified prompts to the AI pipeline and semantically comparing the results to the baseline results. In one example, the prompt engine can continue asking the AI pipeline to modify the prompts until the results fall within the semantic threshold. In another example, the prompt engine can be configured to request modified prompts a predetermined number of times, such as two or three times.

In one example, the prompt engine can notify an admin for, or as part of, the corrective action. For example, the prompt engine can only notify an admin, and the admin can determine what corrective action to take. As an example, the prompt engine can generate and send a push notification, text message, or email notification with information about the AI pipeline that semantically deviated. In another example, the prompt engine can send a notification in addition to other corrective actions. For example, the prompt engine can request a modified prompt package from the AI pipeline and notify an admin. Alternatively, the prompt engine can request the modified prompt package and wait to send the notification until the application finds a prompt package that brings the results within the threshold semantic similarity or a maximum number of modification attempts is reached. In another example, the prompt engine can send a copy of the modified prompt package to the admin, and the admin can decide whether to apply the modified prompt package.

Although the stages in the above method are described as being performed by a prompt engine, in any of the stages the prompt engine can cause another device or software engine to perform the corresponding action. For example, at stage 110, the prompt engine can cause another device to submit a sequence of content queries to an AI pipeline. At stages 120 and 140, the prompt engine can be notified when another device receives the results. At stage 130, the prompt engine can cause the other device to resubmit the first sequence of inputs to the pipeline. At stage 150, the prompt engine can cause another device to semantically compare the baseline results and the results from the resubmission. At stage 160, another device can identify a semantic divergence by determining that the first and second results semantically deviate more than an allowable predetermined threshold, and that other device can notify the prompt engine. At stage 170, in response to the identified semantic divergence, the prompt engine can cause another device to perform a corrective action.

Causing another device to perform an action can include sending instructions to a device. This can be done using an API call, a direct function call, an internal message with the AI platform, an inter-process communication ("IPC") call, or event-driven architecture, as some examples.

Figure 2:
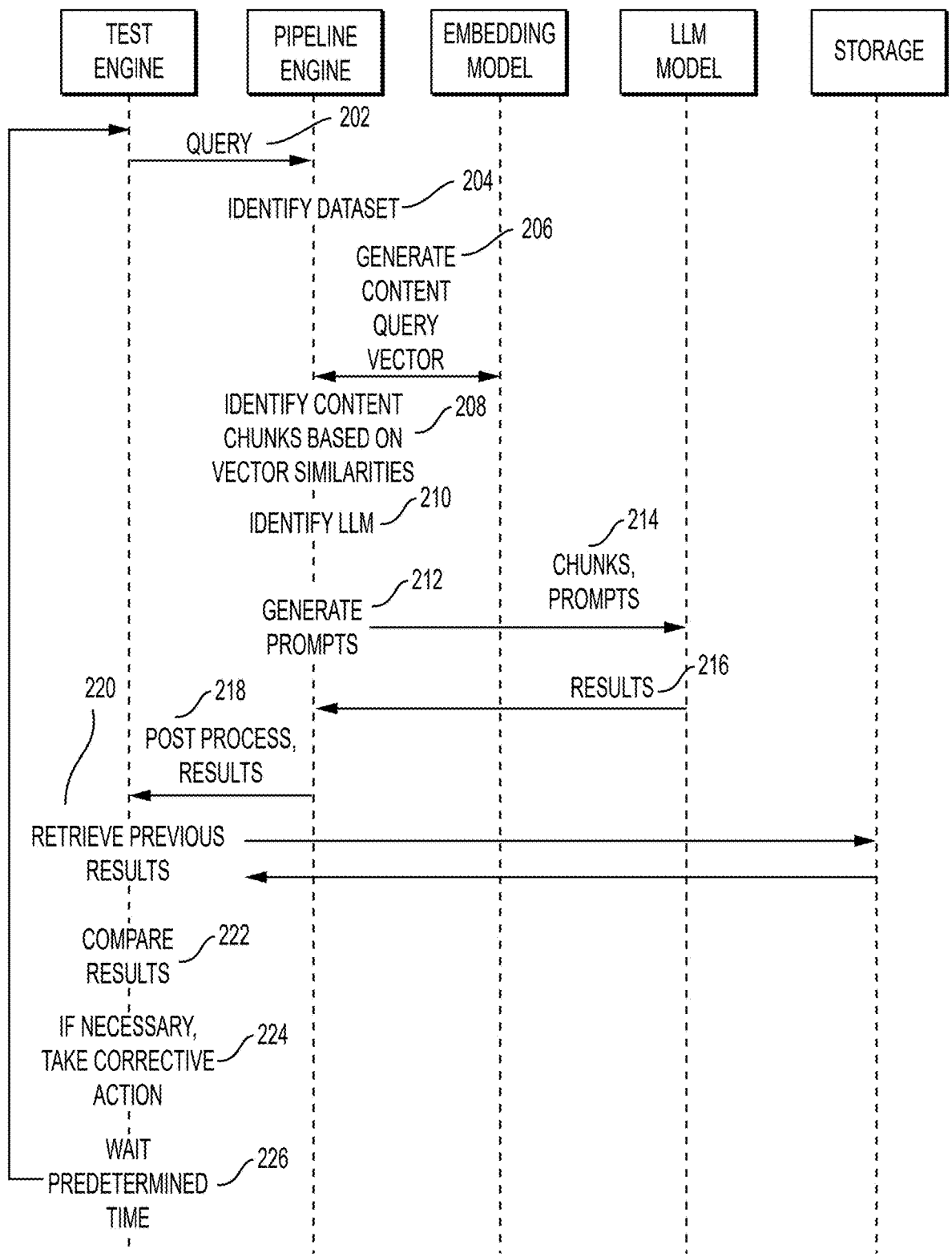
FIG. 2 is a sequence diagram of an example method for maintaining consistent outputs from AI pipelines.

FIG. 2 is a sequence diagram of an example method for maintaining consistent outputs from AI pipelines. This AI pipeline system can be a comprehensive environment that provides the necessary tools, infrastructure, and services to design, develop, deploy, manage, and monitor end-to-end AI workflows. A pipeline in the AI pipeline platform can include a data set, an embedding model, and an LLM. An AI platform can provide the necessary infrastructure, tools, and services to deploy and manage AI pipelines. A pipeline engine in the AI platform can be responsible for processing queries. Prior to a dataset being available for use, the dataset can be broken into chunks according to a dataset policy and chunking parameters. The chunks can be sent to an embedding model. The embedding model can create vectors and metadata from the chunks. These can be output and returned to the AI platform. The platform can use the vectors and metadata to create a VectorDB of the data set. Prior to stage 202, the AI platform can create and store a baseline result in a VectorDB (referred to hereinafter as the "results VectorDB").

At stage 202, a prompt engine can submit a test content query to a pipeline engine. The prompt engine can submit the query using any appropriate communication protocol, such as an API call, a direct function call, an internal message with the AI platform, IPC, event-driven architecture, and so on.

At stage 204, the pipeline engine can identify a dataset as a target of the query. When a query is submitted to the pipeline, the pipeline engine can break the query into chunks according to chunking parameters and send the chunks to the embedding model. At stage 206, the embedding model can vectorize the chunks from the query.

At stage 208, the pipeline engine can compare the query vectors against the VectorDB of the dataset. The pipeline engine can identify the closest vectors, which correlate to the content chunks that are most semantically similar to the query.

At stage 210, the pipeline engine can identify an LLM to use in preparing results that use the identified content chunks of stage 208. In one example, the LLM identified can be an LLM assigned to the associated AI pipeline.

At stage 212, the pipeline engine can generate prompts. The prompts can include enterprise prompts or other pre-created prompts that shape the output of the AI model in a predictable way. This can allow the prompt engine to reliably use the output of the AI model.

At stage 214, the pipeline engine can send the chunks and prompts to an LLM model. This can be done through an API call or with a Software Development Kit ("SDK"). The LLM model performs according to the prompts and sends back results at stage 216.

At stage 218, the pipeline engine can perform post-processing, ensuring that the results include content and format that is expected by the application. Post-processing can include various techniques applied to the raw outputs of the model to improve their quality, relevance, and usability. This can include processes like refining, filtering, formatting, augmenting, customizing, and ensuring coherence of the model's responses. Refining can include using tools like language-specific libraries to correct grammatical errors and typos in the generated text and ensuring proper punctuation and capitalization. Filtering can include Removing or flagging inappropriate, offensive, or irrelevant content. This can involve predefined keyword lists or more sophisticated content moderation algorithms. Filtering can also include detecting and eliminating repetitive or redundant information in the output. Formatting can include applying consistent formatting styles (e.g., bullet points, headings) to ensure a clean and professional appearance. Formatting can also include converting plain text into Markdown or Hypertext Markup Language ("HTML") for better presentation in web applications. Augmentation can include adding additional context or information to enhance the output. This can involve integrating relevant data or explanations. Augmentation can also include linking recognized entities (e.g., names, places) to external databases or resources for further information. Customizing the response based on user preferences or previous interactions. This can involve adjusting tone, formality, or specific interests. Ensuring coherence can include verifying that the generated text is logically coherent and consistent, such as checking for contradictions or illogical statements. This can also include ensuring that the response maintains context with previous interactions or within a multi-turn conversation.

At stage 220, the prompt engine can retrieve the baseline results from the baseline VectorDB. In one example, the prompt engine can query the baseline VectorDB for the baseline results. Alternatively, the application can simply access the VectorDB for comparing the results.

At stage 222, the prompt engine can semantically compare the new results and the baseline results. For example, the new results provided by the LLM can be vectorized, and the prompt engine can create a new results VectorDB with the new results. The prompt engine can then perform a VectorDB comparison of the new results and baseline VectorDBs. In one example, the comparison can result in a similarity score. For example, Euclidean distance, cosine similarity, or Manhattan distance comparisons each result in a value indicating the semantic similarity of the VectorDBs.

At stage 224, if necessary, the prompt engine can perform corrective action. This stage can occur if the semantic similarity diverges more than a threshold amount. For example, a threshold score can be set by an admin user. The threshold score can depend on the type of comparison methodology used. The prompt engine can compare the similarity score to the threshold score. If the similarity score exceeds the threshold (or vice versa, depending on the comparison method used), then the prompt engine can perform the corrective action. If not, then the prompt engine can skip stage 224.

Some examples of corrective actions include notifying an admin and asking the AI pipeline how to modify the prompt package so that the results fall below the threshold. Some examples of modifying the prompt package can include rephrasing the prompt package using synonyms or related terms that are more aligned with the old results, adding relevant terms or phrases from the old results to the prompt package, and using reinforcement learning or optimization techniques to adjust the query iteratively to maximize similarity.

In an example, if the prompt engine is able to modify the prompt package so that the results fall below the threshold, then the prompt engine can save that modification to the pipeline. For example, the prompt engine can modify the prompt package used in the pipeline so that all user queries submitted to the pipeline are automatically corrected.

Notifying an admin of semantic divergence can allow the admin to take other corrective action. For example, the admin can check for updates made to the LLM or the data set. In some instances, the admin may decide that the new results are more desirable than the baseline results. In such an instance, the admin can use an application UI of the AI platform to set the new results as new baseline results. The admin user can also choose to change the LLM or data set used in the pipeline. This may be optimal when, for example, the LLM is updated in a way that negatively impacts the results of all queries. The admin may then decide that the best course of action is to use an entirely different LLM.

At stage 226, the prompt engine can wait a predetermine time before returning to stage 202 to submit another test query. For example, regardless of whether the prompt package is modified, the prompt engine can be configured to periodically run rest queries through the AI pipeline to test whether the results remain consistent with the baseline. As an example, the prompt engine can test the pipeline every day, every two days, or once every week.

Figure 3:
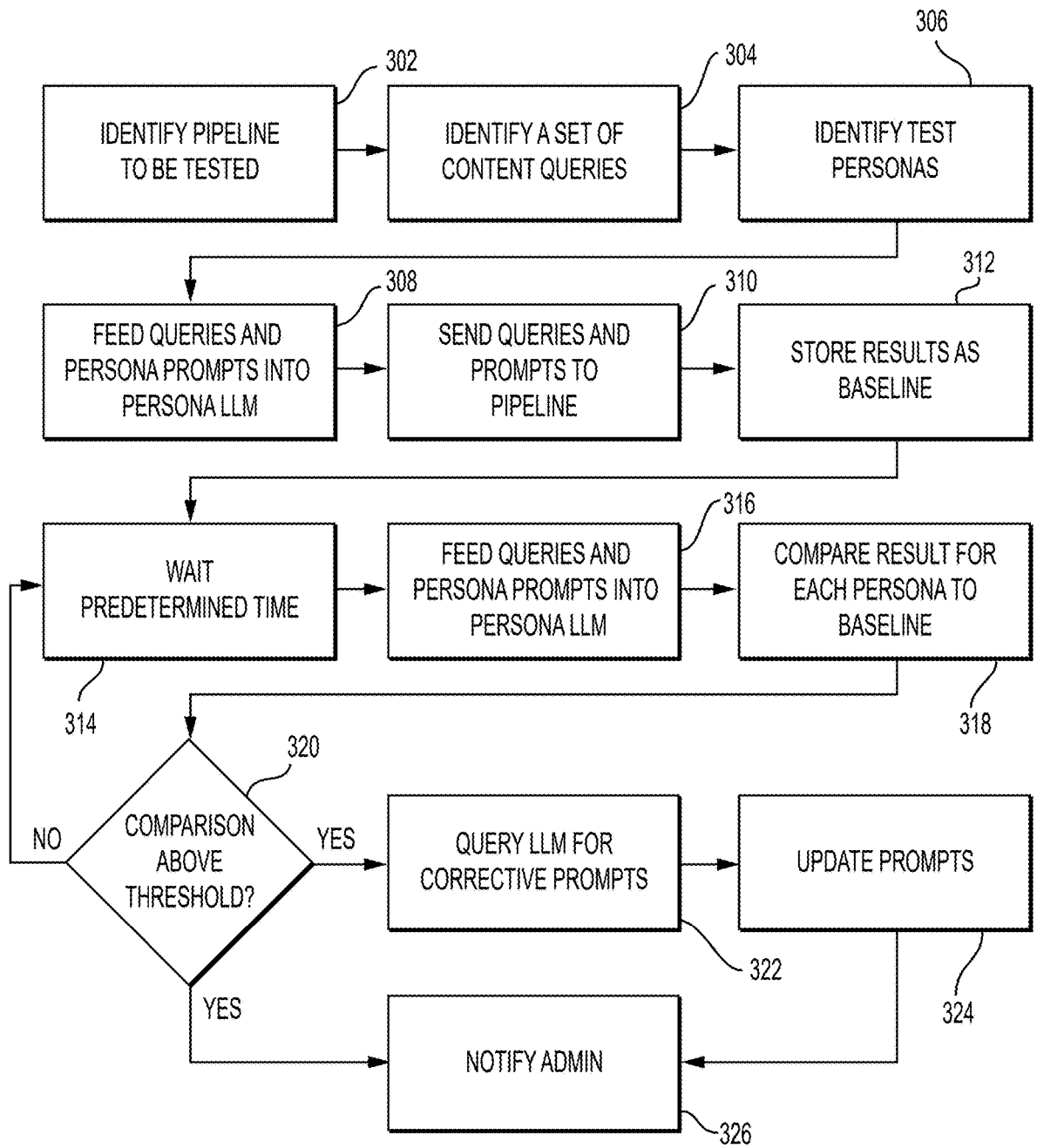
FIG. 3 is a flowchart of an example method for maintaining consistent outputs from AI pipelines.

FIG. 3 is a flowchart of an example method for maintaining consistent outputs from AI pipelines. At stage 302, a prompt engine can identify a pipeline to be tested. For example, using a UI for managing AI pipelines, a user can designate AI pipelines for semantic drift testing. The user can choose how often a pipeline should be tested and a threshold of allowable semantic drift.

At stage 304, the prompt engine can identify a set of content queries to utilize in the prompt testing. In one example, the content queries can be previously created by an admin specifically for testing results from a pipeline. The results of each query can be stored in connection with the content query. In such an example, the prompt engine can retrieve the test query set from a storage location and input the test query into the query field. In another example, a user or the prompt engine can type or speak a test query into a query field.

At stage 306, the prompt engine can identify test personas. A persona can be a set of characteristics, behaviors, styles, and preferences that define the way an LLM interacts with users. It is essentially a predefined identity or role of the "user" submitting the test queries to the pipeline. The prompt engine can test the pipeline using multiple personas to broaden the scope of testing. For example, results provided under one persona may fall within the allowable threshold, but results provided under another persona may not. In an example, personas can be implemented using prompts. For example, the prompt package for a test set of queries can include a prompt for a persona. The prompt can define the persona based on attributes, behavior, and contextual knowledge. The attributes can identify key attributes of the persona, such as tone, style, domain expertise, and attitude. The behavior can determine how the persona should behave in interactions (e.g., friendly, professional, humorous). The contextual knowledge can designate the level of context awareness and personalization the persona should exhibit. When processing the test queries, the LLM in the pipeline will tailor the response to the persona. At stage 308, the prompt engine can feed the set of queries with the persona prompt into a persona LLM, which is an LLM that adopts a persona and interacts with the pipeline for testing. For example, changes in the pipeline can cause results to change. These changes may or may not semantically diverge from the baseline results. However, a set of predefined queries may not properly respond to each subsequent result in the series. This can cause the test to essentially fail because the LLM in the pipeline does not properly understand the test queries in the context of the previously provided results. To prevent this, the prompt engine can feed the queries into the persona LLM with prompt instructions to modify each query based on the pipeline results. The prompt can instruct the persona LLM to modify the queries in such a way that they maintain semantic similarity to the corresponding test query in the set. The persona LLM can also modify each test query in the set so that the test query adopts the assigned persona.

The pipeline engine can receive the queries from the persona LLM and process them. For example, the pipeline engine can chunk the test query and apply an embedding model to create vector embeddings of the chunks. The pipeline engine can package the chunks with any relevant data chunks from the data source of the pipeline and send this package to the LLM. The LLM can process the data from the pipeline engine, craft a response, and send the results to the pipeline engine. The pipeline engine can then provide the results to the persona LLM, which the prompt engine can access at stage 310.

When a response is received, the prompt engine can feed the next query from the set to the persona LLM with instructions to modify the query based on the persona prompt and the results received from the previous query. The prompt engine can continue this process until all test queries in the set have been sent.

At stage 312, the prompt engine can store results as a baseline. The results can be stored in text form, vector form, or both. In an example, the prompt engine can store the results in a VectorDB where the results can be accessed and compared at a later time.

At stage 314, the prompt engine can wait a predetermined amount of time. The prompt engine can be configured to wait any amount of time, such as a day, three days, a week, or a month. An admin can designate the waiting time based on how often the admin wants the pipeline to be tested. In some examples, the prompt engine can also allow the admin to manually execute a test on a pipeline. This can be particularly useful if the admin is aware of an update made to a component of the pipeline that may affect results.

At stage 316, the prompt engine can feed the test queries and persona prompts again into the persona LLM. The queries can be the same queries sent at stage 308 so that the results can be directly compared to the baseline results. The persona LLM can modify each test query based on the persona in the prompt and send the modified query to the pipeline engine. The pipeline engine can process the new queries and send the results back to the persona LLM, which the prompt engine can access.

At stage 318, the prompt engine can compare results for each persona to its corresponding baseline. For example, for each persona the prompt engine can do a VectorDB comparison with the baseline results for the same persona. The prompt engine can do this for each persona to determine whether any of the results have diverged from their baseline.

At stage 320, if the comparison exceeds a threshold, then the prompt engine can return to stage 314 and wait a predetermined amount of time. For example, if the new results fall within an allowable amount of divergence from the baseline, then no further action is needed, and the prompt engine can wait to run the test again at a later time.

If the comparison does not exceed the threshold, then at stage 322, the prompt engine can attempt to find a way to modify the prompt (or add a new prompt) that would cause the test query results to fall below the divergence threshold. For example, the prompt engine can send a new query to the pipeline (or, alternatively, another LLM) asking how to modify the query so that the results are more semantically similar to the baseline. The query can include the baseline results and the persona for which the results diverged. In one example, the prompt engine can iteratively change and test new prompts.

At stage 324, the prompt engine can update or add a prompt if it finds a prompt that corrects the semantic divergence. The new prompt can be used moving forward to test the pipeline. In one example, the prompt engine can first send the new prompt to the pipeline and semantically compare the results to ensure that the new results are semantically similar to the baseline. The prompt engine also update the production prompt package with the new prompt so that customers receive consistent results when using the pipeline.

Alternatively, or in addition to acquiring a new prompt, at stage 326, the prompt engine can notify an admin. This can allow an admin to manually review the pipeline, queries, and results to determine whether corrective action is needed. In some examples, the admin can determine that the new results are preferable over the baseline. Rather than modify the prompt, the admin can save the new results as new baseline results. In another example, the admin can manually modify the prompt. In still another example, the admin can make changes to the data set or the LLM being used in the pipeline.

Figure 4:
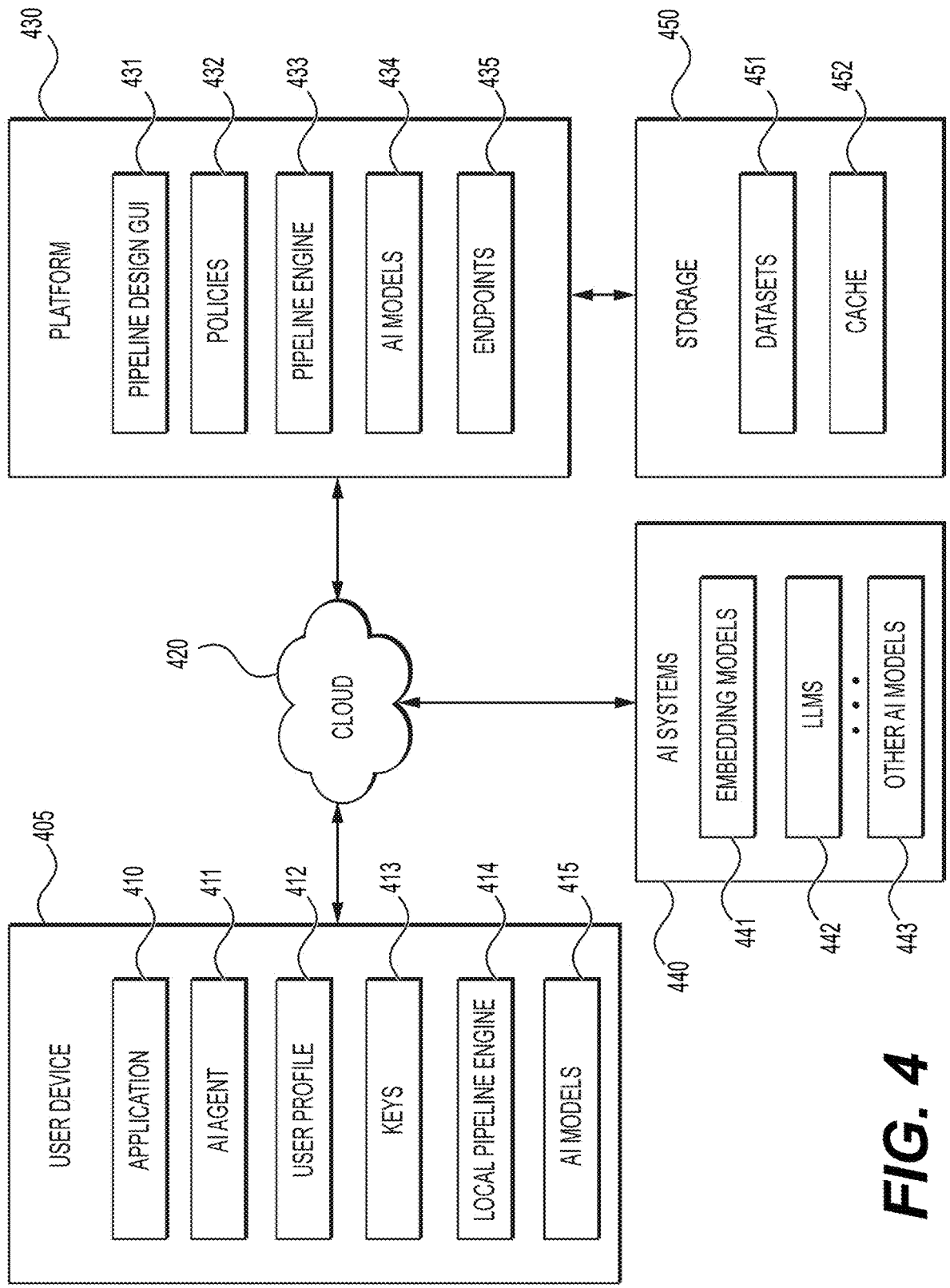
FIG. 4 is an example diagram of example system components for an AI pipeline system.

FIG. 4 is an example diagram of example system components for an AI platform that provides AI pipeline services to customers. This example is a high-level overview of interactions between a user device 405, AI platform 430, AI systems 440, and cloud storage 450. The user device 405 can communicate with the platform 430 over a network, such as the internet. Some or all of the platform 430 can execute in the cloud 420, across one or more servers. For example, pipeline endpoints 435 can be deployed for execution in the cloud 420.

As shown, a user device 405 can connect to an endpoint 435 over a network. The user device can be any processor-enabled device, such as a phone, laptop, tablet, headset, or server. An application 410 can execute on the user device 405. The application can be configured to utilize an AI pipeline that is generated by the platform 430.

In one example, the application 410 enrolls with the platform and is assigned a user profile 412. An AI agent 411 can be provisioned from the platform 430 to the user device 405. The AI agent 411 can monitor various device settings and ensure that the device 405 is compliant with management policies 432 at the platform 430. The AI agent 411 can execute separately from the application 410 or be part of the application 410, in different implementations.

When the application 410 enrolls with the platform 430, the platform can provide an endpoint location (such as an URL) and a key for authenticating access when connecting to the pipeline. Other data can be provisioned to the user device 405 by the platform 430. For example, one or more datasets that are commonly used with the application 410 can be downloaded independently or as part of the application. This can allow for local pipeline execution in some circumstances. For this purpose, a local pipeline engine 414 can be installed on the user device. The local pipeline engine 414 can be part of the AI agent 411 or the application 410 in an example. The role of the local pipeline engine 414 is to manage dependencies of the local pipeline during localized execution. AI models 415 can also be installed locally for use in the local pipeline execution. The AI models 415 can include one or more embedding models and LLMs, for example. The local pipeline engine 414 can manage inputs and outputs to these local AI models 415 in an example.

The platform 430 includes a GUI for designing pipelines. An administrative user can access the GUI and create new pipelines and edit existing pipelines. The stages of the pipelines can be presented onscreen, with models, datasets, prompts, code, and policies available for inclusion in a pipeline. Pipelines can be conditional as well, with different models and prompts utilizes depending on a variety of factors. The factors include compliance with management policies 432. For example, particular models may have model policies that dictate the number of uses per allotted time, the size of a dataset that can be used with the model, maximum number of input tokens (which can correlate to words or characters), and others.

User policies can also be set such that different users have access to different AI models 415, 434. In one example, even local AI models 415 can be managed such that a user must be part of an enterprise or some other group in order to access the AI model 415. This way, if the user leaves the organization, an administrator can change the user's status, which causes the AI agent to update the user profile 412 on the user device 405. This can prevent, for example, an ex-employee from using a local enterprise AI model 415 that is trained on enterprise data. Likewise, a dataset policy can be attached to a particular dataset, requiring a particular user status from the user profile (such as employed, a particular group within a company, access level, etc.).

Speed policies 432 can also be incorporated as conditions when designing an AI pipeline. If a result takes too long to retrieve from a vector search, then a faster but less accurate LLM can be used to prepare the result. Likewise, cached speed information can cause the pipeline to bypass or favor particular steps. Additionally, when the user device 405 is offline, the AI agent or local pipeline engine 414 can specify using local AI models 415. But if the device 405 is online, then an online endpoint 435 can be used to execute the remote pipeline, including platform AI models 434 and those of third-party AI systems 440. Alternatively, some stages can execute locally and others remotely in the cloud. The AI agent 411 and the pipeline engine 433 can communicate with one another remotely to manage such dependencies.

In short, the pipeline design GUI 431 allows administrative users (associated with the platform 430 or the application 431) to create and change the AI pipelines used by applications 410. When a pipeline is changed, a new endpoint 435 and key 413 can be supplied to the AI agent 411 from the platform 430 for use with the application 410.

The platform 430 can execute on one or more hardware servers. The platform can also utilize physical storage 450 to store datasets 451 and cached data 452. The storage 450 can be located in the cloud. The datasets 451 can be vectorized into vector databases with corresponding data chunks. The chunks or the vectors can include metadata that the pipeline utilizes to link the vectors to the chunks. The metadata can also include flags that allow for chunk retrieval without a vector search, such as based on cached data 452 for queries. Such queries may be overly time or processor intensive to repeat.

Once a pipeline is designed, it can be deployed at an endpoint 435. The pipeline engine 433 can manage execution of the pipeline at the endpoint 435. This can include sending and receiving data to and from AI systems 440. For example, some searches may require or benefit from embedding models 441, LLMs 442, or other AI models 443 than those that are directly managed by the platform. The pipeline engine 433 can supply necessary credentials, such as keys, to those AI systems 440.

Figure 5:
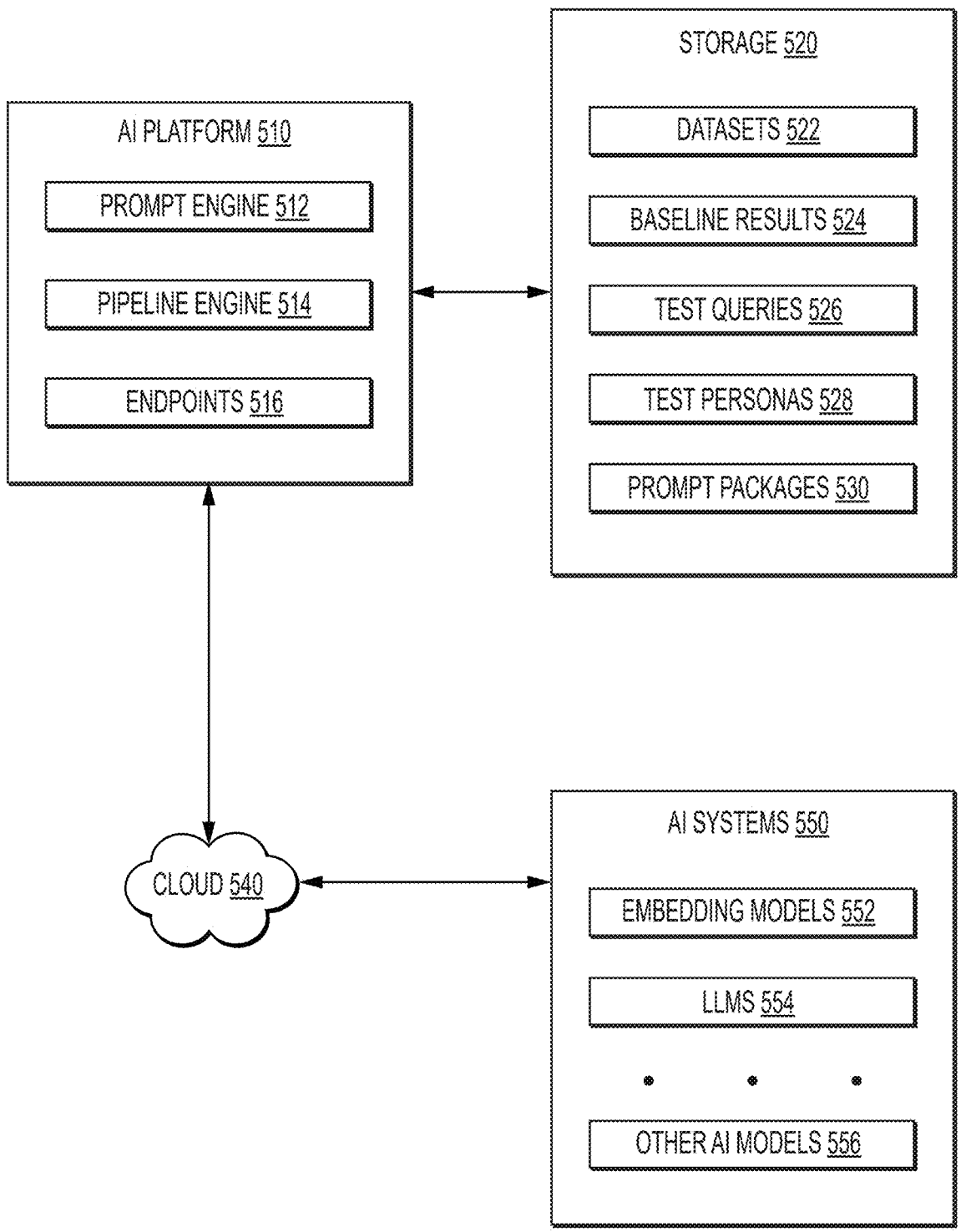
FIG. 5 is an example diagram of system components for testing an AI pipeline, and specifically a prompt package used in an AI pipeline.

FIG. 5 is an example diagram of system components for testing an AI pipeline. This example is a high-level overview of interactions between a prompt engine 512 and a pipeline engine 514 of an AI platform 510, AI systems 540, and cloud storage 520. Some or all of the platform 510 can execute in the cloud 540, across one or more servers. For example, pipeline endpoints 516 can be deployed for execution in the cloud 540.

Pipelines can include datasets 522, prompt packages 530, and an LLM 554. The datasets can prompt packages can be retained in the cloud storage 520. The pipeline engine 514 can manage execution of pipelines at the endpoint 516. This can include sending and receiving data to and from AI systems 550. For example, some searches may require or benefit from embedding models 552, LLMs 554, or other AI models 556 than those that are directly managed by the platform. The pipeline engine 514 can supply necessary credentials, such as keys, to those AI systems 550.

The prompt engine 512 can be responsible for testing pipelines for semantic divergence. To do so, the prompt engine 512 can send test inputs such as queries 526 to the pipeline engine 514. The pipeline engine processes these inputs like a normal query from a user. The test queries 526 can be a single query or a set of queries. The prompt engine can send each test query 526 with a test persona 528, which is a prompt that defines a persona of the inquiring user in the test. In some examples, the prompt engine 512 can first send each test query 526 and test persona 528 to an AI model 556 to obtain a modified test query based on the persona. The prompt engine can then send the modified test query to the pipeline engine 514. When a sequence of test queries are used, the prompt engine 512 can send the latest response, the current test query 526, and the test persona 528 to an AI model 556 to obtain a crafted response that implements the test query in response to the last results that incorporates the test persona.

The first time the prompt engine 512 tests a pipeline by sending the test queries 526 to the pipeline engine 524, the prompt engine 512 can save those results as baseline results 524. The pipeline engine 524 can be configured to test compare testing results to the baseline results 524 for semantic divergence. The pipeline engine 524 can test the pipeline automatically so that semantic divergence is detected as soon as possible.

Figure 6:
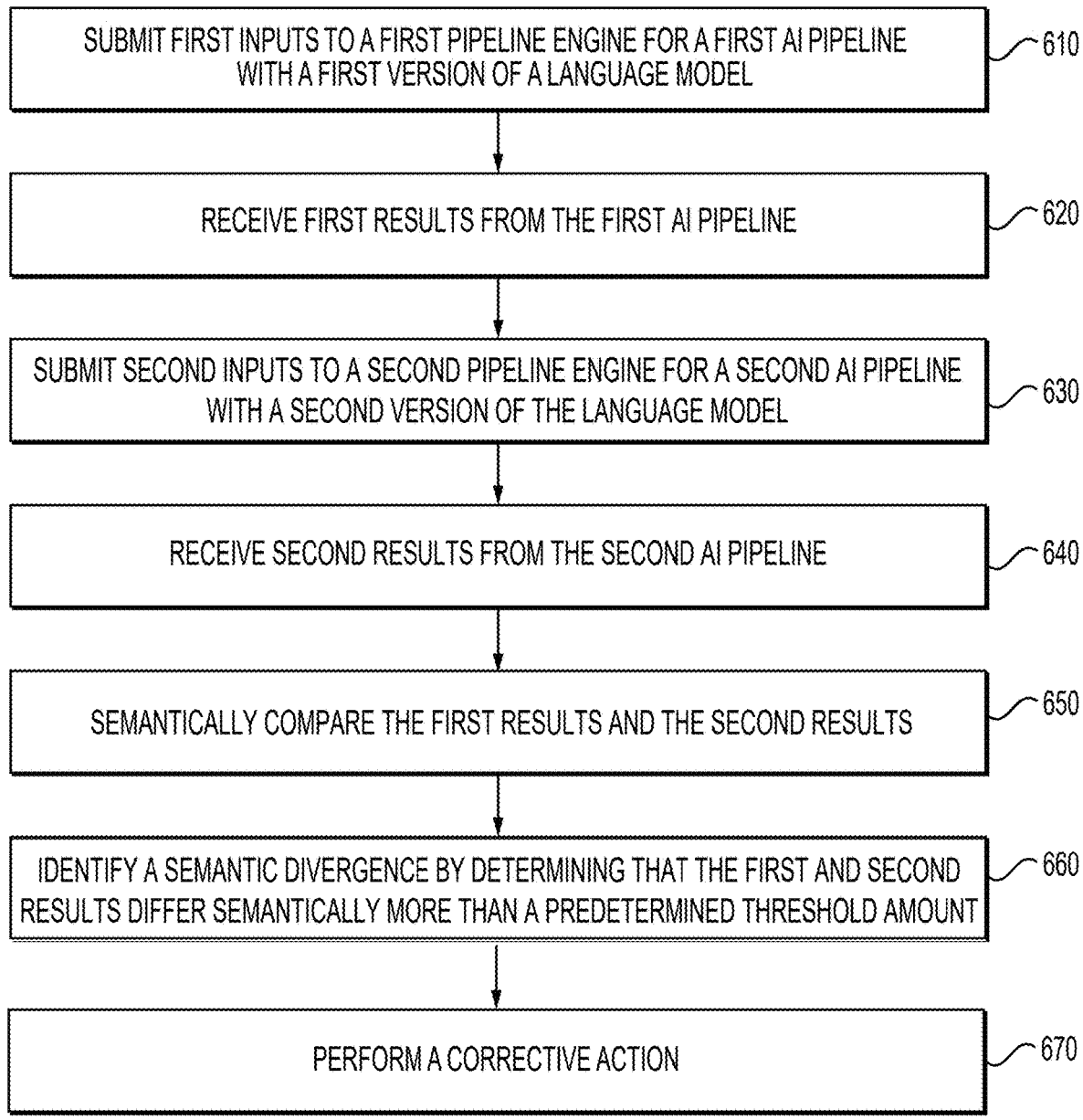
FIG. 6 is a flowchart of an example method for maintaining consistent outputs from different versions of a language model in AI pipelines.

FIG. 6 is a flowchart of an example method for maintaining consistent outputs from different versions of a language model in AI pipelines. The method described below can determine whether prompt packages are forward and backward compatible with different versions of an LLM. If two versions of an LLM output results that are semantically similar, then that can give customers flexibility in using cheaper versions of a model for some employees/users. For example, executives or paid users can be given access to pipelines that use a newer version of the model, and other users can be given access to cheaper or free models. In another example, this method can be used to determine whether paying for a higher tier is necessary. For example, if prompts can be identified that make results from free and paid tiers of an LLM semantically similar, then an admin or customer can choose to use the free version.

At stage 610, a prompt engine can submit input (e.g., a content query) to a pipeline engine for an AI pipeline with a first version of an LLM. The content query can be a sequence or list of test queries. The prompt engine can utilize personas to perform multiple different tests of the model as described previously herein. After receiving the query, the pipeline engine can process the query through the pipeline. For example, the pipeline engine can query a vector database that includes one or more datasets. The pipeline engine can identify a dataset associated with the query. This information can be part of the query itself, in an example. If the application has capabilities to search multiple different datasets, then the query can indicate which ones are applicable. A default dataset can be used with particular applications.

The pipeline engine can vectorize the content query using the embedding model associated with the identified dataset. The pipeline engine generates content query vectors with the same embedding model that generates a vector database for the identified dataset. To perform a multidimensional search with the content query, the pipeline engine can compare the query vectors output from the embedding model against the vector database of the identified dataset. To identify similar vectors (i.e., those with similar semantic meaning), the distance and/or angle between the vectors can be determined. The closer the two vectors, the closer in meaning they are.

The pipeline engine can then retrieve chunks that correspond to the identified similar vectors. The chunks can be stored in the vector database with the corresponding vectors. The vectors can be embedded with metadata that allows the pipeline engine to locate the corresponding content item, user access permissions, location of the respective chunk within the content item.

The pipeline engine can then utilize an AI service with an LLM (or other language model). The pipeline can be configured to a certain version of the LLM. For example, the prompt engine can send test queries through two different pipelines. Each of the two pipelines can be identical except for the LLM. One can use an older version of the LLM and one can use a newer version. The pipeline engine can send prompts to the identified AI service. The prompts can be part of a prompt package maintained for use with the AI service in the particular pipeline.

At stage 620, the pipeline engine can receive first results from the AI service. Those results can be further processed according to the particular pipeline, such as by adding annotations or hyperlinks to relevant documents and sections. This can alternatively be done by the AI service, in an example. The processed results can then be sent to the prompt engine.

The prompt engine can save the results from the query. For example, the prompt engine can store the baseline results in a storage device, such as a database server or a cache. In one example, the results can be saved in a VectorDB. The prompt engine can save various forms of the baseline results. As an example, the prompt engine can save the text response that would be displayed to a user. The prompt engine can also save the vector embeddings created from the query and vectors associated with the baseline results.

At stage 630, the prompt engine can submit second inputs to a pipeline engine for an AI pipeline with a second version of the LLM. The second version can be a newer or higher tiered version of the LLM. For example, some AI services offer access to different tiers of an LLM, such as a paid tier with a newer version and a free tier with an older version. In one example, the same pipeline engine can be used for both sets of queries. In such an example, the prompt engine can send the queries using different accounts that have different levels of access to the pipelines. The pipeline engine can send the queries to the appropriate pipeline based on the account access levels. Alternatively, a different pipeline engine can be used for the first and second queries.

Upon receiving the query, the pipeline engine can process the query in the same or a similar manner to the first query, except the pipeline engine can submit the prompts to the alternate version of the LLM. For example, the pipeline engine can send account or credential information to the AI service with the prompts. The AI service can process the query through the second version of the LLM based on the account information, which can include permissions indicating the version to use. In some instances, some users can have access to multiple versions of an LLM model. For example, a paid account may have access to a paid version and a free version of an LLM. To handle this, the query from the prompt engine can indicate with LLM version to use, and the pipeline engine can indicate the version to the AI service. In one example, the pipeline engine can send the prompts to different AI service endpoints, depending on the LLM version being used.

The AI service can process the prompts through the LLM, process the results, and send the results back to the pipeline engine. The prompt engine can then obtain the results from the pipeline engine.

At stage 640, the pipeline engine can receive second results from the AI service. Those results can be further processed according to the particular pipeline, such as by adding annotations or hyperlinks to relevant documents and sections. This can alternatively be done by the AI service, in an example. The processed results can then be sent to the prompt engine.

At stage 650, the prompt engine can semantically compare the two results. For example, the prompt engine can vectorize both sets of results the results and save them as VectorDBs. The prompt engine can then do a VectorDB comparison. The prompt engine can then calculate the distance between corresponding pairs of vectors from the baseline and new sets. Some distance metrics that can be used include Euclidean distance, cosine similarity, or Manhattan distance.

At stage 660, the prompt engine can identify a semantic divergence by determining that the first and second results semantically deviate more than an allowable predetermined threshold. The predetermined threshold can depend on the method used to determine semantic similarity. For example, if the prompt engine performs the semantic comparison using Euclidean distance or Manhattan distance, then the threshold can be a maximum distance. If cosine similarity is used, the threshold can be a minimum angle between vectors. The prompt engine can compare the measured value to the threshold value.

At stage 670, the prompt engine can perform a corrective action. The corrective actions can be one or more actions. An admin user can configure the corrective action that the application performs. In one example, the prompt engine can request the AI pipeline to modify the prompt package so that the original query (or string of queries) returns results that are more similar to the baseline results from the first query. The prompt engine can allow the AI pipeline to decide how to modify the prompt package, or, alternatively, the prompt engine can specify a method for modifying the prompt package. Non-exhaustive examples of modifying the prompt package can include rephrasing the prompt package using synonyms or related terms that are more aligned with the old results, adding relevant terms or phrases from the old results to the prompt package, and using reinforcement learning or optimization techniques to adjust the prompts iteratively to maximize similarity.

The prompt engine can test the modified prompts by submitting a new query with the modified prompt to one of the AI pipelines and semantically comparing the new results to the old results of the other pipeline. For example, the prompt engine can obtain a new or modified prompt to use with the first version of the LLM. The prompt engine can send the original test query to the first LLM version through the pipeline engine with the new prompt in the prompt package. The prompt engine can then compare the new results to the original results from the second LLM version to see if they are semantically similar within the predetermined threshold.

In one example, the prompt engine can continue asking the AI pipeline to modify the prompt until the results fall within the semantic threshold. In another example, the prompt engine can be configured to request modified prompts a predetermined number of times, such as two or three times.

Although the stages in the above method are described as being performed by a prompt engine, in any of the stages the prompt engine can cause another device or software engine to perform the corresponding action. For example, at stage 610, the prompt engine can cause another device to submit input to a pipeline engine for an AI pipeline with a first version of an LLM. At stages 620 and 640, the prompt engine can be notified when another device receives the results. At stage 630, the prompt engine can cause the other device to submit second inputs to a pipeline engine for an AI pipeline with a second version of the LLM. At stage 650, the prompt engine can cause another device to semantically compare the two results. At stage 660, another device can identify a semantic divergence by determining that the first and second results semantically deviate more than an allowable predetermined threshold, and that other device can notify the prompt engine. At stage 670, in response to the identified semantic divergence, the prompt engine can cause another device to perform a corrective action.

Figure 7A:
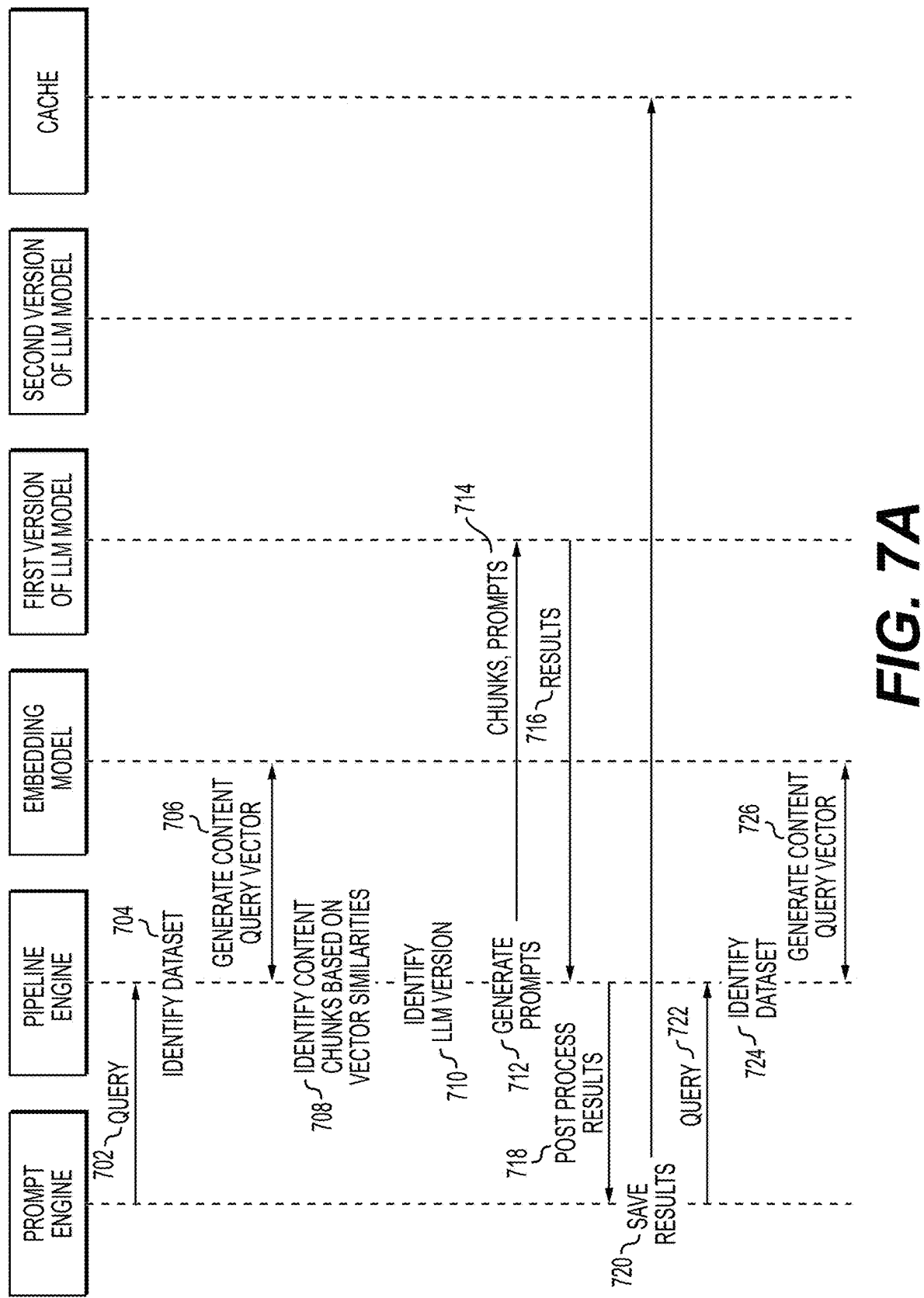
FIG. 7A is a sequence diagram of an example method for maintaining consistent outputs from different versions of a language model in AI pipelines.
Figure 7B:
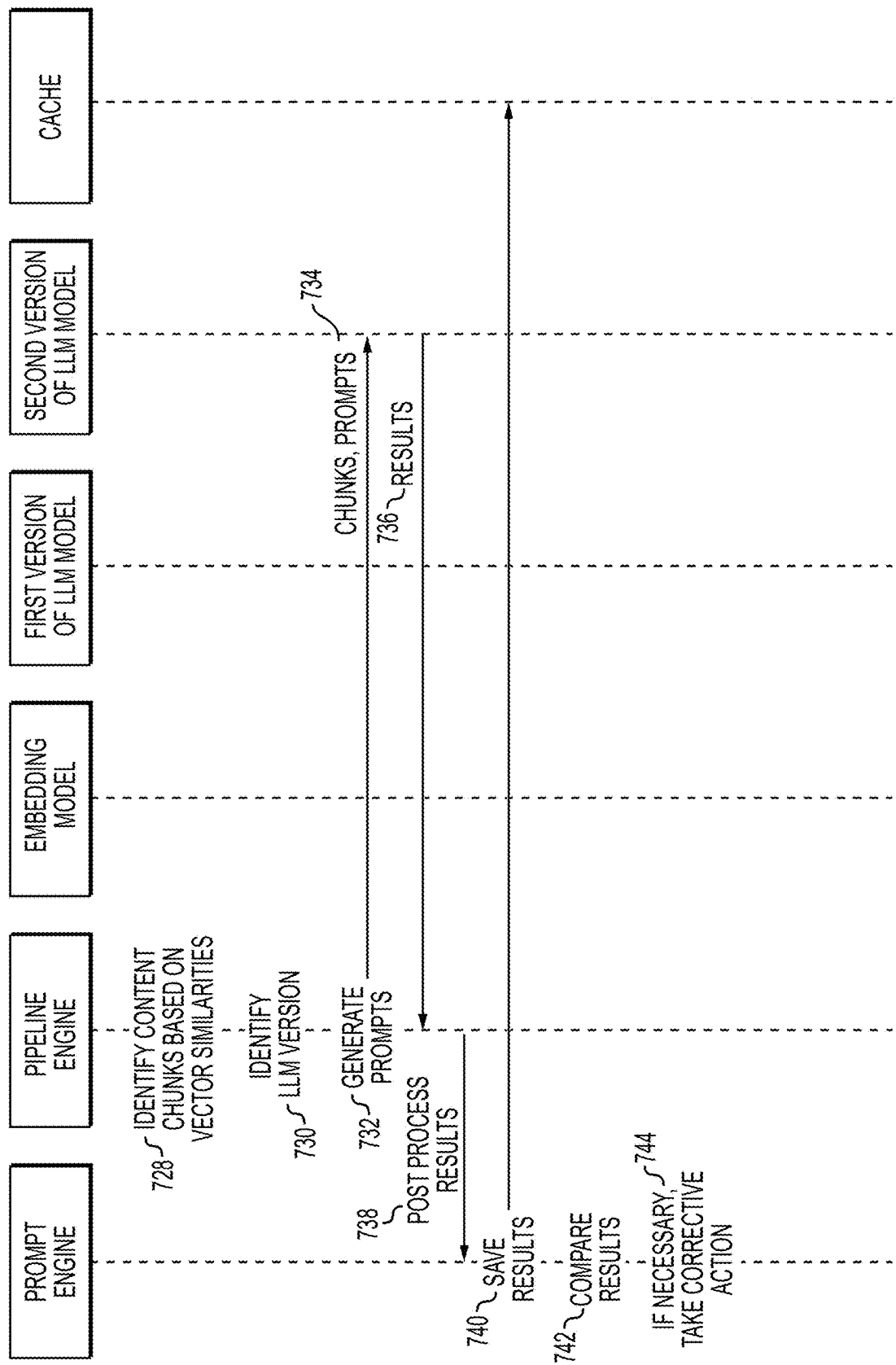
FIG. 7B is a continuation of FIG. 7A.

Causing another device to perform an action can include sending instructions to a device. This can be done using an API call, a direct function call, an internal message with the AI platform, an IPC call, or event-driven architecture, as some examples FIGS. 7A and 7B are a sequence diagram of an example method for maintaining consistent outputs from different versions of a language model in AI pipelines. At stage 702, a prompt engine can submit a test content query to a pipeline engine for a first version of an LLM. The prompt engine can submit the query using any appropriate communication protocol, such as an API call, a direct function call, an internal message with the AI platform, an IPC call, event-driven architecture, and so on.

At stage 704, a pipeline engine can identify a dataset as a target of the query. When a query is submitted to the pipeline, the pipeline engine can break the query into chunks according to chunking parameters and send the chunks to the embedding model. At stage 706, the embedding model can vectorize the chunks from the query.

At stage 708, the pipeline engine can compare the query vectors against the VectorDB of the dataset. The pipeline engine can identify the closest vectors, which correlate to the content chunks that are most semantically similar to the query.

At stage 710, the pipeline engine can identify the first version of an LLM to use in preparing results that use the identified content chunks of stage 708. In one example, the LLM and version identified can be an LLM assigned to the associated AI pipeline.

At stage 712, the pipeline engine can generate prompts. The prompts can include enterprise prompts or other pre-created prompts that shape the output of the AI model in a predictable way. This can allow the prompt engine to reliably use the output of the AI model.

At stage 714, the pipeline engine can send the chunks and prompts to the first version of the LLM model. This can be done through an API call or with an SDK, for example. The first version of the LLM model performs according to the prompts and sends back results at stage 716.

Moving to FIG. 7B, at stage 718, the pipeline engine can perform post-processing, ensuring that the results include content and format that is expected by the application. Post-processing can include various techniques applied to the raw outputs of the model to improve their quality, relevance, and usability.

At stage 720, the prompt engine can save the results in a cache. The cache can be any short-term memory storage. The results can be stored in the cache so that they can quickly be compared to results from the second LLM version. In an example, the results can be saved in a VectorDB format. In an example where the test query is a sequence of queries, stages 702-720 can be repeated for each query in the sequence.

At stage 722, the prompt engine can submit a test content query to a pipeline engine for a second version of the LLM. The prompt engine can submit the query using any appropriate communication protocol, such as an API call, a direct function call, an internal message with the AI platform, an IPC call, event-driven architecture, and so on. The test content query (or sequence of queries) for the second LLM version can be identical to the content query for the first LLM version in stage 702 so that the semantic similarity of the results can be most accurately analyzed.

At stage 724, the pipeline engine can identify a dataset as a target of the query. When a query is submitted to the pipeline, the pipeline engine can break the query into chunks according to chunking parameters and send the chunks to the embedding model. At stage 726, the embedding model can vectorize the chunks from the query.

At stage 728, the pipeline engine can compare the query vectors against the VectorDB of the dataset. The pipeline engine can identify the closest vectors, which correlate to the content chunks that are most semantically similar to the query.

At stage 730, the pipeline engine can identify the second version of the LLM to use in preparing results that use the identified content chunks of stage 728. In one example, the LLM and version identified can be an LLM assigned to the associated AI pipeline. For example, the first content query sent at stage 702 can be sent to a first pipeline associated with the first LLM version, and the second content query sent at stage 722 can be sent to a second pipeline associated with the second LLM version.

At stage 732, the pipeline engine can generate prompts. The prompts can include enterprise prompts or other pre-created prompts that shape the output of the AI model in a predictable way. This can allow the prompt engine to reliably use the output of the AI model.

At stage 734, the pipeline engine can send the chunks and prompts to the first second of the LLM model. This can be done through an API call or with an SDK, for example. The second version of the LLM model performs according to the prompts and sends back results at stage 736.

At stage 738, the pipeline engine can perform post-processing, ensuring that the results include content and format that is expected by the application. Post-processing can include various techniques applied to the raw outputs of the model to improve their quality, relevance, and usability.

At stage 740, the prompt engine can save the results to the cache in vector form so that they can be compared to the first results from stage 720.

At stage 742, the prompt engine can semantically compare the results from both queries (or sets of queries). For example, the results from both LLM versions can be received and stored as vectors, and the prompt engine can execute a VectorDB comparison on the two sets of results. In one example, the comparison can result in a similarity score. For example, Euclidean distance, cosine similarity, or Manhattan distance comparisons each result in a value indicating the semantic similarity of the VectorDBs.

At stage 744, if necessary, the prompt engine can perform a corrective action. This stage can occur if the semantic similarity diverges more than a threshold amount. For example, a threshold score can be set by an admin user. The threshold score can depend on the type of comparison methodology used. The prompt engine can compare the similarity score to the threshold score. If the similarity score exceeds the threshold (or vice versa, depending on the comparison method used), then the prompt engine can perform the corrective action.

Some examples of corrective actions include notifying an admin and sending a new query through one of the pipelines asking how to modify the prompt package so that the results are more semantically similar. Some examples of modifying the prompt package can include rephrasing the prompt package using synonyms or related terms that are more aligned with the old results, adding relevant terms or phrases from the old results to the prompt package, and using reinforcement learning or optimization techniques to adjust the prompts iteratively to maximize similarity.

In an example, if the prompt engine is able to modify the prompt package (or add a new prompt to the prompt package) so that the results fall below the threshold, then the prompt engine can save the new or modified prompt to the pipeline. For example, the prompt engine can modify the prompt package used in the pipeline so that all user queries submitted to the pipeline are automatically corrected.

Notifying an admin of semantic divergence can allow the admin to take other corrective action. For example, the admin can determine whether the older version of the LLM version is outdated and should be taken out of production. In another example, the admin can create different AI pipeline tiers that use a newer or older version of the same LLM.

Other examples of the disclosure will be apparent to those skilled in the art from consideration of the specification and practice of the examples disclosed herein. Though some of the described methods have been presented as a series of steps, it should be appreciated that one or more steps can occur simultaneously, in an overlapping fashion, or in a different order. The order of steps presented is only illustrative of the possibilities and those steps can be executed or performed in any suitable fashion. Moreover, the various features of the examples described here are not mutually exclusive. Rather any feature of any example described here can be incorporated into any other suitable example. It is intended that the specification and examples be considered as exemplary only, with a true scope and spirit of the disclosure being indicated by the following claims.

What is claimed is:

1. A method for maintaining consistent results from different versions of a language model in AI pipelines, comprising:
    submitting, by a prompt engine, first inputs to a first pipeline engine for a first AI pipeline, wherein the first AI pipeline includes a first prompt package and a first version of a language model, and wherein the first prompt package and at least a portion of the first inputs are sent to the first version of the language model;
    receiving first results from the first AI pipeline in response to the first inputs;
    submitting, by the prompt engine, second inputs to a second AI pipeline, wherein the second AI pipeline includes the first prompt package and a second version of the language model, and wherein the first prompt package and at least a portion of the second inputs are sent to the second version of the language model,
        wherein the second inputs include a semantically similar sequence of queries as the first inputs, wherein the semantically similar sequence of queries modifies one of the first inputs with a language model to take into account a prior result received from the second AI pipeline,
        wherein the semantically similar sequence of queries corresponds to vectors having a threshold variance in distance or angle to vectors of the first inputs, and
        wherein the first and second inputs correspond to a first test persona associated with a group identifier for a first group among a plurality of enterprise groups, and
            wherein the group identifier is utilized in retrieving data chunks in executing the first and second AI pipelines;
    receiving second results from the second AI pipeline in response to the second inputs;
    vectorizing the first results and the second results;
    semantically comparing the vectorized first results and the vectorized second results;
    identifying a semantic divergence by determining that the vectorized first results and the vectorized second results differ semantically more than a predetermined threshold amount;
    visually indicating the semantic divergence of the first and second results within the semantically similar sequence of queries; and
    in response to the determination, performing a corrective action to the first prompt package with regard to the second version of the language model.

2. The method of claim 1, wherein the corrective action includes sending a corrective query to the first version of the language model, prompting the first version of the language model to suggest a change to the first prompt package to reduce the semantic divergence, wherein a corrective prompt suggestion is received from the first version of the language model in response, wherein a second prompt package including the corrective prompt suggestion is saved in association with the second version of the language model.

3. The method of claim 2, further comprising:
    testing the corrective prompt suggestion, including:
        adding the corrective prompt suggestion to the first prompt package to create a test prompt package;
        submitting, by the prompt engine, the second inputs to the second pipeline, wherein the second pipeline uses the test prompt package;
        receiving third results from the second pipeline;
        vectorizing the third results; and
        semantically comparing the vectorized third results to the vectorized first results;
    wherein the visual indication and saving of the second prompt package occur in an instance where the semantic comparison of the vectorized first and third results meets a semantic similarity threshold.

4. The method of claim 3, wherein submitting the second inputs subsequent to adding the corrective prompt suggestion includes rephrasing multiple of the second inputs based on some of the third results, wherein the second version of the language model or another language model rephrases the second inputs to retain a threshold level of semantic meaning while utilizing the third results, and wherein the rephrased multiple of the second inputs are submitted to the second pipeline.

5. The method of claim 1, wherein performing the corrective action includes prompting an administrator with an option to add a corrective prompt suggestion to the first prompt package, and wherein selection of the option causes the saving of the second prompt package in association with the second version of the language model.

6. The method of claim 1, wherein another language model rephrases the first and second inputs based on multiple test personas, including the first test persona, each test persona being described by a respective persona prompt package, and wherein the first and second results are stored separately in sets that correspond to each of the test personas for purposes of identifying the semantic divergence for that respective test persona.

7. The method of claim 1, wherein semantically comparing the vectorized first results and the vectorized second results includes calculating one of a Euclidean distance, cosine similarity, or Manhattan distance between vector pairs in the first results and the second results.

8. A non-transitory, computer-readable medium containing instructions that, when executed by a hardware-based processor, causes the processor to perform stages for maintaining consistent results from different versions of a language model in AI pipelines, comprising:
    submitting, by a prompt engine, first inputs to a first pipeline engine for a first AI pipeline, wherein the first AI pipeline includes a first prompt package and a first version of a language model, and wherein the first prompt package and at least a portion of the first inputs are sent to the first version of the language model;

receiving first results from the first AI pipeline in response to the first inputs;

submitting, by the prompt engine, second inputs to a second AI pipeline, wherein the second AI pipeline includes the first prompt package and a second version of the language model, and wherein the first prompt package and at least a portion of the second inputs are sent to the second version of the language model, wherein the second inputs include a semantically similar sequence of queries as the first inputs, wherein the semantically similar sequence of queries modifies one of the first inputs with a language model to take into account a prior result received from the second AI pipeline, wherein the semantically similar sequence of queries corresponds to vectors having a threshold variance in distance or angle to vectors of the first inputs, and wherein the first and second inputs correspond to a first test persona associated with a group identifier for a first group among a plurality of enterprise groups, and wherein the group identifier is utilized in retrieving data chunks in executing the first and second AI pipelines;

receiving second results from the second AI pipeline in response to the second inputs;

vectorizing the first results and the second results;

semantically comparing the vectorized first results and the vectorized second results;

identifying a semantic divergence by determining that the vectorized first results and the vectorized second results differ semantically more than a predetermined threshold amount;

visually indicating the semantic divergence of the first and second results within the semantically similar sequence of queries; and in response to the determination, performing a corrective action to the first prompt package with regard to the second version of the language model.

9. The non-transitory, computer-readable medium of claim 8, wherein the corrective action includes sending a corrective query to the first version of the language model, prompting the first version of the language model to suggest a change to the first prompt package to reduce the semantic divergence, wherein a corrective prompt suggestion is received from the first version of the language model in response, wherein a second prompt package including the corrective prompt suggestion is saved in association with the second version of the language model.

10. The non-transitory, computer-readable medium of claim 9, the stages further comprising:

testing the corrective prompt suggestion, including:
adding the corrective prompt suggestion to the first prompt package to create a test prompt package;
submitting, by the prompt engine, the second inputs to the second pipeline, wherein the second pipeline uses the test prompt package;
receiving third results from the second pipeline;
vectorizing the third results; and
semantically comparing the vectorized third results to the vectorized first results; and wherein the visual indication and saving of the second prompt package occur in an instance where the semantic comparison of the vectorized first and third results meets a semantic similarity threshold.

11. The non-transitory, computer-readable medium of claim 10, wherein submitting the second inputs subsequent to adding the corrective prompt suggestion includes rephrasing multiple of the second inputs based on some of the third results, wherein the second version of the language model or another language model rephrases the second inputs to retain a threshold level of semantic meaning while utilizing the third results, and wherein the rephrased multiple of the second inputs are submitted to the second pipeline.

12. The non-transitory, computer-readable medium of claim 8, wherein performing the corrective action includes prompting an administrator with an option to add a corrective prompt suggestion to the first prompt package, and wherein selection of the option causes the saving of the second prompt package in association with the second version of the language model.

13. The non-transitory, computer-readable medium of claim 8, wherein another language model rephrases the first and second inputs based on multiple test personas, including the first test persona, each test persona being described by a respective persona prompt package, and wherein the first and second results are stored separately in sets that correspond to each of the test personas for purposes of identifying the semantic divergence for that respective test persona.

14. The non-transitory, computer-readable medium of claim 8, wherein semantically comparing the vectorized first results and the vectorized second results includes calculating one of a Euclidean distance, cosine similarity, or Manhattan distance between vector pairs in the first results and the second results.

15. A system for maintaining consistent results from different versions of a language model in AI pipelines, comprising:

a memory storage including a non-transitory, computer-readable medium comprising instructions; and at least one hardware-based processor that executes the instructions to carry out stages comprising:

causing, by a prompt engine, a submission of first inputs to a first pipeline engine for a first AI pipeline, wherein the first AI pipeline includes a first prompt package and a first version of a language model, and wherein the first prompt package and at least a portion of the first inputs are sent to the first version of the language model;

receiving first results from the first AI pipeline in response to the first inputs;

causing, by the prompt engine, submission of second inputs to a second AI pipeline, wherein the second AI pipeline includes the first prompt package and a second version of the language model, and wherein the first prompt package and at least a portion of the second inputs are sent to the second version of the language model, wherein the second inputs include a semantically similar sequence of queries as the first inputs, wherein the semantically similar sequence of queries modifies one of the first inputs with a language model to take into account a prior result received from the second AI pipeline, wherein the semantically similar sequence of queries corresponds to vectors having a threshold variance in distance or angle to vectors of the first inputs, and wherein the first and second inputs correspond to a first test persona associated with a group identifier for a first group among a plurality of enterprise groups, and wherein the group identifier is utilized in retrieving data chunks in executing the first and second AI pipelines;

receiving second results from the second AI pipeline in response to the second inputs;

causing vectorization of the first and second results;

causing, by the prompt engine, a semantic comparison of the vectorized first results and the vectorized second results, wherein a semantic divergence is identified by determining that the first results and the second results differ semantically more than a predetermined threshold amount;

visually indicating the semantic divergence of the first and second results within the same of semantically similar sequence of queries; and in response to the identifying, causing performance of a corrective action to the first prompt package with regard to the second version of the language model.

16. The system of claim 15, wherein the corrective action includes causing a corrective query to be sent to the first version of the language model, prompting the first version of the language model to suggest a change to the first prompt package to reduce the semantic divergence, wherein a corrective prompt suggestion is received from the first version of the language model in response, wherein a second prompt package including the corrective prompt suggestion is saved in association with the second version of the language model.

17. The system of claim 16, the stages further comprising:
testing the corrective prompt suggestion, including:
causing the corrective prompt suggestion to be added to the first prompt package to create a test prompt package;
causing, by the prompt engine, a third submission of the second inputs to the second pipeline, wherein the second pipeline uses the test prompt package;
receiving third results from the second pipeline; and
causing vectorizing of the third results;
causing a semantic comparison of the vectorized third results to the vectorized first results;
in an instance where the semantic comparison of the first and third vectorized results meets a semantic similarity threshold, causing notification of an administrative user of the corrective prompt suggestion.

18. The system of claim 17, wherein causing the third submission of the second inputs to the second pipeline includes rephrasing multiple of the second inputs based on some of the third results, wherein the second version of the language model or another language model rephrases the second inputs to retain a threshold level of semantic meaning while utilizing the third results, and wherein the rephrased multiple of the second inputs are submitted to the second pipeline.

19. The system of claim 15, wherein causing performance of the corrective action includes prompting an administrator with an option to add a corrective prompt suggestion to the first prompt package, and wherein selection of the option causes saving of the second prompt package in association with the second version of the language model.

20. The system of claim 15, wherein another language model rephrases the first and second inputs based on multiple test personas, including the first test persona, each test persona being described by a respective persona prompt package, and wherein the first and second results are stored separately in sets that correspond to each of the test personas for purposes of identifying the semantic divergence for that respective test persona.

* * * * *